United States Patent [19]
Conti

[11] Patent Number: 4,777,654
[45] Date of Patent: Oct. 11, 1988

[54] TRANSMITTER/RECEIVER

[75] Inventor: David A. Conti, Stevenage, England

[73] Assignee: British Aerospace Public Limited Company, London, England

[21] Appl. No.: 124,420

[22] Filed: Nov. 19, 1987

Related U.S. Application Data

[63] Continuation of Ser. No. 22,516, Mar. 9, 1987, abandoned, which is a continuation of Ser. No. 787,093, Oct. 15, 1985, abandoned.

[30] Foreign Application Priority Data

Oct. 12, 1984 [GB] United Kingdom ............... 8425875

[51] Int. Cl.$^4$ .............................................. H04B 1/40
[52] U.S. Cl. ......................................... 455/81; 455/80; 455/327; 455/328
[58] Field of Search ................... 455/80, 81, 327, 328; 343/779, 786, 100 R, 100 PE

[56] References Cited

U.S. PATENT DOCUMENTS

| | | | |
|---|---|---|---|
| 2,839,683 | 6/1958 | Cacheris | 455/81 |
| 3,383,628 | 5/1968 | Tschannen | 455/81 |
| 3,789,406 | 1/1974 | Wernli | 455/81 |
| 4,259,741 | 3/1981 | Kaneko et al. | 455/81 |
| 4,480,336 | 10/1984 | Wong et al. | 455/328 |
| 4,541,120 | 9/1985 | Szabo | 455/327 |
| 4,541,124 | 9/1985 | Lacour et al. | 455/327 |

Primary Examiner—Michael A. Masinick
Attorney, Agent, or Firm—Cushman, Darby & Cushman

[57] ABSTRACT

A combined duplexer/mixer especially for use in an FMCW millimetric radar system has a waveguide section containing a fin line or suspended strip structure for responding to the linearly polarized radar return signal passing through the section in one direction while permitting passage of the orthogonally polarized, outgoing signal passing in the other direction. The fin line is coupled via double balanced mixer diodes to an IF output line to produce an IF signal by mixing the return signal with a portion of the outgoing signal tapped off by a field distorting probe, ridge section or like coupling means.

2 Claims, 4 Drawing Sheets

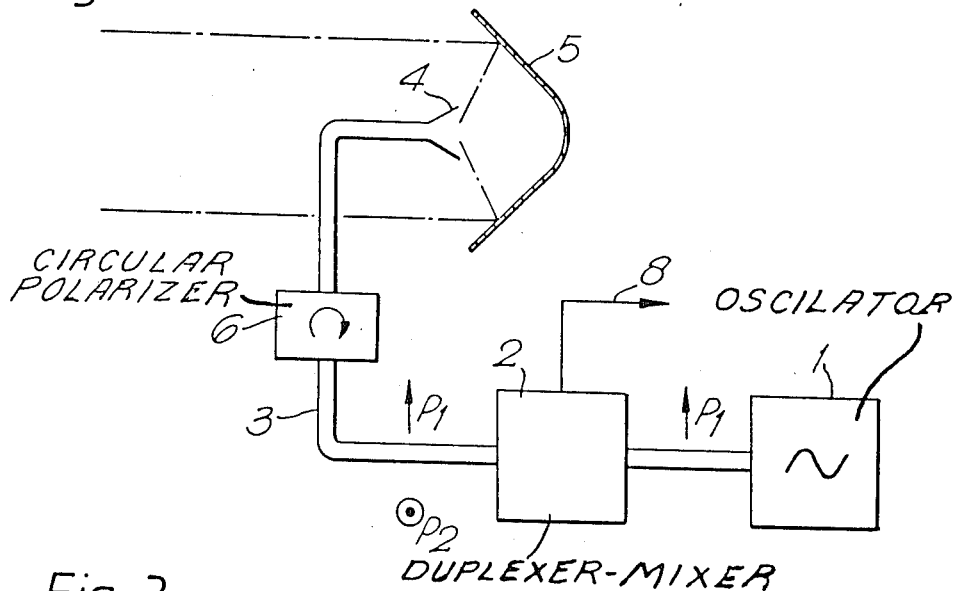
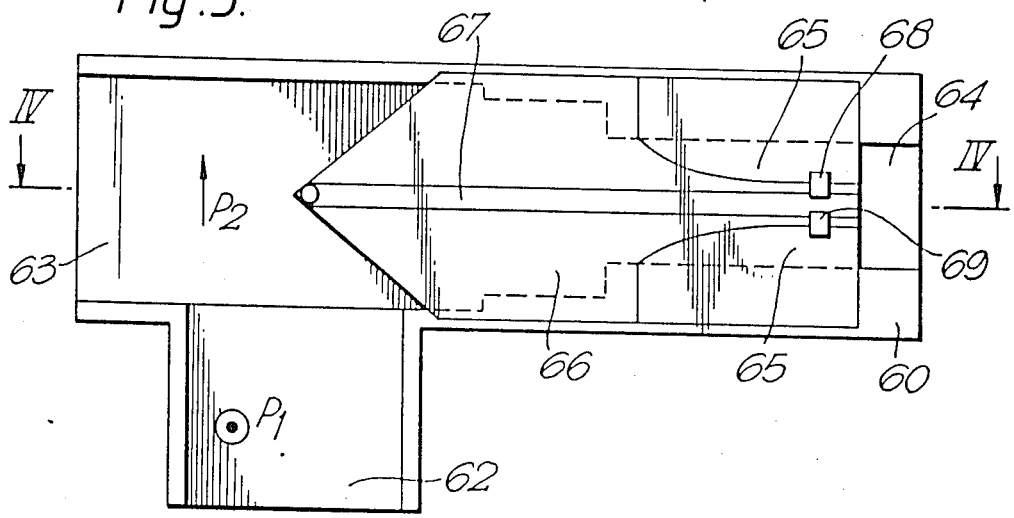
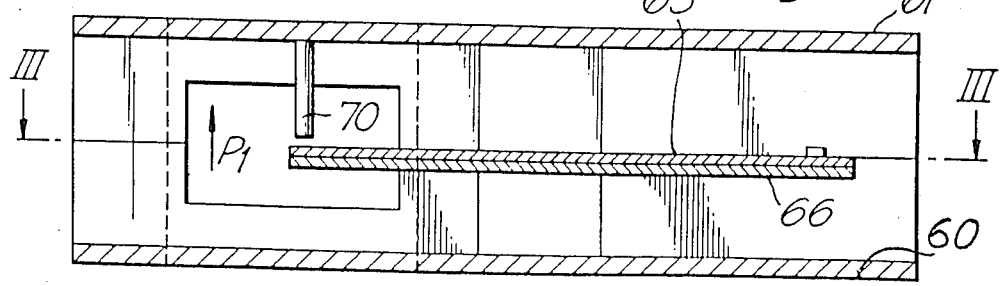

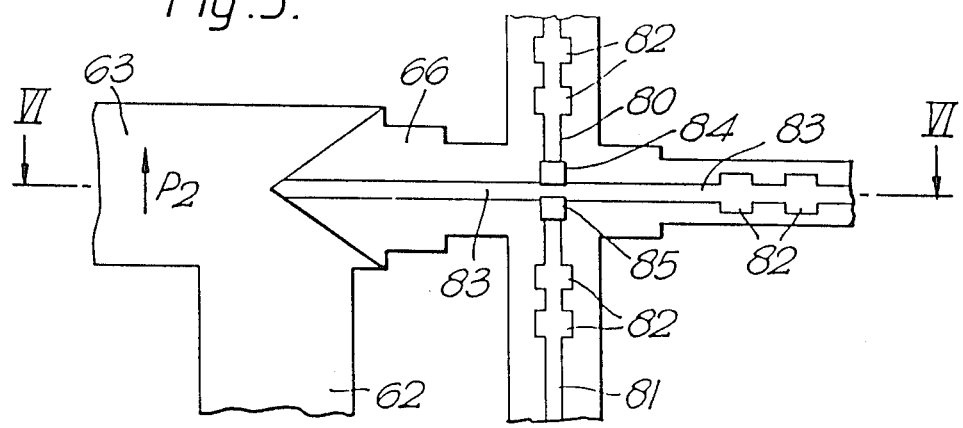
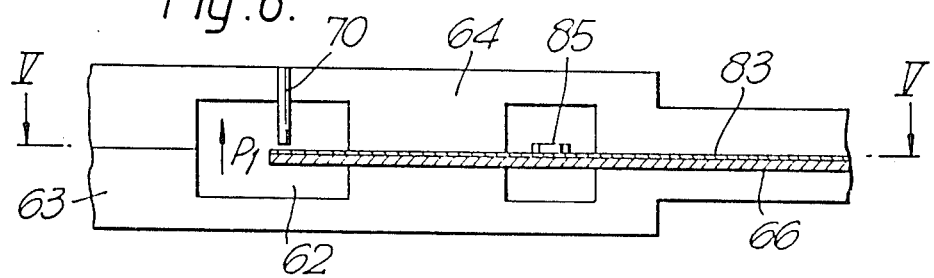
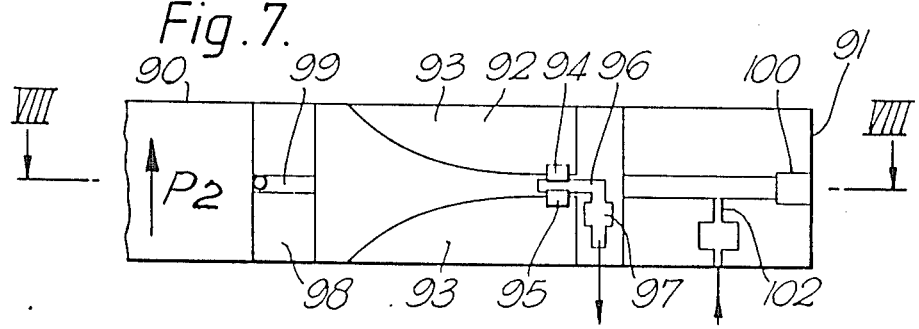
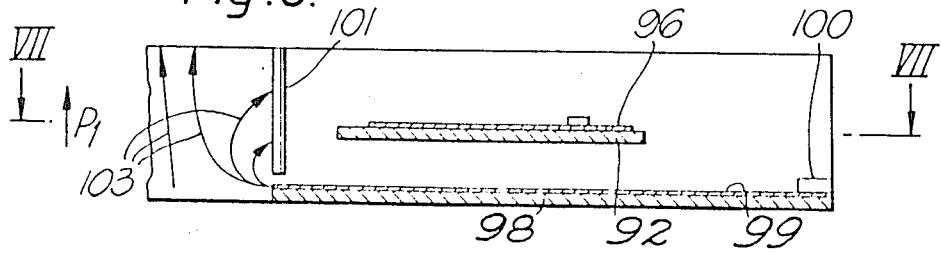

TRANSMITTER/RECEIVER

This is a continuation of application Ser. No. 022,516, filed Mar. 9, 1987, which was abandoned upon the filing hereof which is a continuation of Ser. No. 787,093 filed Oct. 15, 1985, now abandoned.

BACKGROUND OF THE INVENTION

This invention relates to transceivers and in particular though not exclusively to FMCW transceivers operable in the millimeter wavelength band.

Presently the difficulty of providing good transmit and receive channel isolation for monostatic CW radars becomes further aggravated at high frequencies (millimeter waveband) due to the poor performance of circulators which are the basis of the conventional approach.

One method of providing separate channels with an "in principle" infinite isolation, is to use the ability of a suitably dimensioned waveguide (usually square or circular) to support two independent crossed polarizations. However, if the transmit and receive beams are simply crossed linear polarizations, poor performance results due to an effective loss of target echo.

Much of this loss can be retrieved by using crossed circular polarization. A scheme of this nature is proposed in "Applications of the Turnstile Junction" by Meyer and Goldberg, IRE Transactions MT and T December 1955 using the properties of the "Turnstile Junction". This scheme does not, however, conveniently permit the use of balanced mixers which are essential for good overall sensitivity.

There is a requirement for a simple low cost miniaturized FMCW microwave system.

SUMMARY OF THE INVENTION

It is an object of this invention to provide such a system.

According to one aspect of the invention there is provided a FMCW system for operation with crossed circular polarization characterized by a duplexer and mixer wherein part of the transmitted output power is extracted by a probe aligned with the linear polarization of the transmission and said extracted power is fed directly to a balanced mixer for mixing with the received power.

According to another aspect, there is provided a combined microwave duplexer and mixer comprising a waveguide section, a circuit structure within said section for receiving first microwave energy polarized in one direction of polarization and passing through the section in one direction of travel while, in itself, being relatively unresponsive to second microwave energy polarized transverse to said one direction and passing through the section opposite to said one direction of travel, coupling means within the section for causing a portion of said second microwave energy to be tapped off and to appear within said circuit structure, and diode means within the section for causing said first energy and said tapped off portion of the second energy to become mixed and to produce an IF signal.

BRIEF DESCRIPTION OF THE DRAWINGS

By way of example one embodiment of the invention will now be described and further embodiments indicated with reference to the accompanying figures in which:

FIG. 1 is a block diagram of a transceiver;

FIG. 3 is a plan view, sectioned on line III—III of FIG. 4, of a second duplexer/mixer device;

FIG. 4 is a section on line IV—IV of FIG. 3;

FIG. 5 is a plan view, sectioned on line V—V of FIG. 6, of a third duplexer/mixer device;

FIG. 6 is a section on line VI—VI in FIG. 5,

FIG. 7 is a plan view sectioned on line VII—VII in FIG. 8, of a combined mixer/duplexer/oscillator device;

FIG. 8 is a section view on line VIII—VIII of FIG. 7;

DETAILED DESCRIPTION OF THE PREFERRED EXEMPLARY EMBODIMENT

Figure 2:
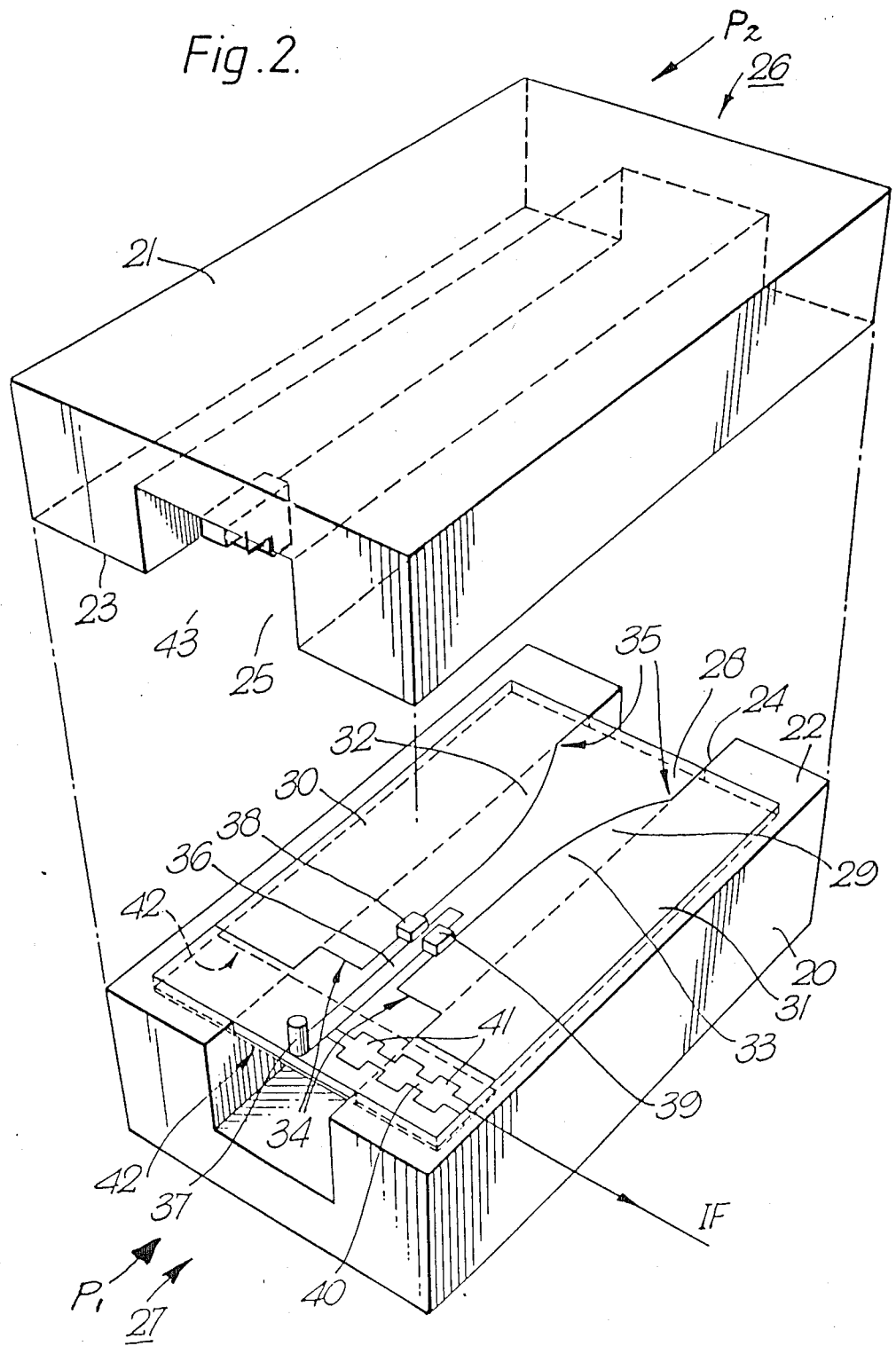
FIG. 2 is a perspective view of a combined duplexer/mixer device used in the transceiver of FIG. 1.

The transceiver of FIG. 1 comprises a transmitter drive oscillator 1 of which the output, linearly polarized in direction $P_1$, is fed via a duplexer/mixer 2, waveguide 3 and an antenna feed 4 to a reflector 5 from whence the signal is radiated. The radiated signal is given a circular polarization by any suitable circular polarizing means which may be of a kind well known in the art. For example, a known form of circular polarizing device 6 may be coupled into the waveguide 3 as shown, Alternatively, the antenna reflector 5 could be provided with a polarizing ridge or grating structure (not shown) or a radome (not shown), which in some applications would be provided in front of reflector 5, or may incorporate a suitable grating structure so that the transmitted signal becomes circularly polarized after it has left the reflector ie while it is passing through the radome. These alternative techniques are also known in the art.

As is further known, the radar return signal will possess a circularly polarized component in a direction or 'hand' opposite to that of the transmitted signal. Thus, on passing through the polarizer 6 (or the alternative polarizing means), the return signal will become linearly polarized in direction $P_2$ orthogonal to the polarization direction $P_1$ of the signal sent out from duplexer/mixer 2. Within the duplexer/mixer 2, the return or $P_2$ signal is mixed, by a balanced mixing process, with what could be called a local oscillator or reference signal which is formed by tapping off a portion of the $P_1$ signal from oscillator 1, so as to form an IF (intermediate frequency) output signal 8. Thus, the device 2 combines the functions of a duplexer (for permitting passage of the $P_1$ signal from the oscillator 1 to waveguide 3 while directing the $P_2$ signal from waveguide 3 to an auxilliary port), a tapping device (for tapping off a portion of the signal from oscillator 1) for a local oscillator signal, and a balanced mixer for forming the IF signal.

As shown in FIG. 2, the duplexer/mixer 2 comprises two rectangular metal blocks 20 and 21 which are normally secured together by any suitable fixing means (not shown) but which are shown separated for clarity. The mating faces 22 and 23 of the blocks 20 and 21 have respective rectangular recesses 24 and 25 formed therein so that, when the blocks are fixed together, the recesses form a square waveguide extending through the assembly. The transmission signal from the oscillator 1, polarized in direction $P_1$, is coupled to this waveguide at the end 27 of the assembly while, at the end 26 of the assembly, it is coupled to the waveguide 3 of FIG. 1. A shallow rectangular recess is formed in the face 22 of block 20 extending on each side of recess 24 and along this recess to near the ends 26 and 27. Into this recess, there is fitted a sheet of dielectric material 28 such that, when the blocks are assembled together, sheet 28 extends across the waveguide formed by recesses 24 and 25 in the direction orthogonal to direction $P_1$. On one surface of this sheet, (the upper surface in FIG. 2) there is provided a metallization pattern 29 which includes portions 30 and 31 which will lie between the blocks 20 and 21 at respective sides of the recesses 24 and 25 and portions 32 and 33 which each lie over the recess 24, which extend along the recess 24 from a first position 34 spaced from that end of sheet 28 which is near the end 27 of the assembly to a second position 35 close to end 26, which extend toward each other so as to be relatively closely spaced from one another at the first position 34, and which curve away from another proceeding towards the second position 35. Thus, the portions 32 and 33 define a fin line structure within the assembled waveguide. An elongate metallization strip 36 is provided on sheet 28 extending between the portions 32 and 33, from a short way in from position 34 out to the end of the sheet 28 near assembly end 27. Connected to the strip 36 at this end of the sheet, there is a short upstanding probe 37. At a point between the fin line metallization portions 32 and 33, the strip 36 is coupled to the portions 32 and 33 each side of it by way of two diodes 38 and 39. Also, at a point between the probe 37 and the nearest end of metallization portion 31, the strip 36 is connected to a microstrip IF output line 40 formed by a suitable metallization pattern on the surface of sheet 28, for example including three RF decoupling patches 41 as shown, and extending out to the side of the block 20 where it is connected to a suitable IF output connector (not shown). On the other face of sheet 28, ie the lower face in FIG. 2, there is provided a metallization pattern 42 which extends across recess 24 and beneath line 40 so as to form a ground plane therefor. One of the metallization portions 30 and 31 is overlaid by a thin insulating sheet or coating (not shown) so as to insulate it from block 21 when the blocks are assembled together. A d.c. bias potential for the diodes 38 and 39 can then be applied via connections (not shown) to the insulated one of portions 30 and 31 and to the other of these portions or to the assembly itself. Insulation is also provided between line 40 and block 21 of course.

Owing to the orientation of the fin line structure, the $P_1$ signal from the oscillator 1 of FIG. 1 passes through the waveguide defined by the recesses 24 and 25 substantially unmodified (the presence of the fin line structure acting only to form, in effect a bifurcated waveguide) except that a small portion of it will become tapped off by the probe 37. Meanwhile the return signal entering the duplexer/mixer waveguide at end 26 and polarized in the orthogonal direction $P_2$ becomes coupled in to the fin line structure and mixed by the diodes 38 and 39 with the portion of the outgoing signal tapped off by probe 37 to form the desired IF signal which is then extracted via line 40.

Instead of the upstanding probe 37, there could be provided a small field distorting post suspended from the top surface of recess 25 in block 21 and extending down to a point close to the metallized strip 36 at the position where the probe 37 is shown. The suspended post would then simply distort the field of outgoing $P_1$ signal sufficiently for a portion of it to become coupled into strip 36. As another alternative to probe 37, there could be suspended from the top surface of recess 25, a stepped member 43 defining a waveguide ridge section for concentrating a portion of the field of the outgoing signal down onto the strip 36. Although both the probe 37 and member 43 are drawn in FIG. 2 it will be appreciated that, as mentioned, they are alternatives. As a yet further alternative, the probe 37 could be replaced by an antipodal fin line structure.

The end 27 of the waveguide through device 2 could be coupled to the drive oscillator 1 by way of a further waveguide (not shown) which could be a rectangular waveguide with a smaller dimension in direction $P_1$ than orthogonal thereto and which can then include a stepped transition up to the square waveguide through the device. The transition could be incorporated in the device 2, ie the blocks 20 and 21 can be extended somewhat at end 27 and, in the extended region, the depths of recesses 24 and 25 can become reduce, say in two steps down to the 'height' (dimension in direction $P_1$) of the rectangular waveguide. Suitably dimensioned, the transition will then permit the outgoing signal to propagate into the device 2 while blocking propagation of the return signal through to the drive oscillator 1.

The presence and illustrated shape of the metallization on the lower face of sheet 28 are not essential, ie the IF output line and/or the strip 36 could be implemented other than as microstrip lines.

FIGS. 3 and 4 show an alternative form of duplexer/mixer in which the two mating blocks 60 and 61 define a T-shaped waveguide of which the stem 62 and one arm 63 are coupled to the oscillator 1 and waveguide 3 respectively of FIG. 1, stem 62 being rectangular and arm 63 being square. The other arm 64 includes a stepped transition to a rectangle with its smallest dimension in direction $P_2$ and this arm contains the fin line structure 65. The sheet 66 carrying the fin line structure but no ground plane metallization this time has a pointed end extending into the area at the join of the stem 62 and arms 63 and 64 and the central suspended strip 67 which is connected to the fin line structure by diodes 68 and 69 as before extends out to the pointed end of the dielectric sheet 66, at which position there is a field distorting post 70 extending down to near the strip 67 from the overlying waveguide surface. This embodiment operates in a way similar to that of the FIG. 2 embodiment but may have better performance in that the rectangular stem 62 is dimensioned to suit the outgoing $P_1$ wave while waveguide arm 64 is constructed to suit the return or $P_2$ signal while defining a cut off for the outgoing or $P_1$ signal.

The embodiment of FIGS. 5 and 6 is similar to that of FIGS. 3 and 4 except that the fin line structure is replaced by a suspended strip circuit comprising two suspended strip lines 80 and 81 with RF choke patches 82 connected to the strip 83 via mixer diodes 84 and 85. The bias for diodes 84 and 85 is applied to the outer ends of suspended strip lines 80 and 81 while the IF signal is extracted from that end of strip 83 which is remote from a field distortion post 70 like that of FIG. 3. Decoupling choke patches 82 are also provided in strip 83. As will have been realized, FIGS. 5 and 6 are diagrammatic in that they show the line of the internal waveguide surface but not the structure or wall which defines it. The remaining FIGS. 7 to 10 are the same in this respect. Naturally, the waveguide defining structure could comprise for example two mating blocks with appropriate shaped recesses therein as described for FIGS. 2 to 4.

FIGS. 7 and 8 show an embodiment using a fin line structure as in FIGS. 2 but further combined with the drive oscillator 1 of FIGS. 1. The waveguide 90 which is shorted at its end 91 contains a dielectric sheet 92 carrying the fin line structure 93 as before along with diodes 94 and 95 coupled to an IF output line 96 including choke 97. Also included is an insulating sheet 98 supporting a microstrip line 99 which extends along the waveguide beneath the sheet 92 from the shorted end 91 of the waveguide where it is coupled to an Impatt or Gunn diode oscillator 100 to beyond the remote or outer end of sheet 92 at which point a post 101 extends down to near the strip from the upper surface of the waveguide. The bias for diode 100 is applied via line 102. The presence of post 101 causes the growth of a transmission field, as shown by field lines 103, from this end of line 99, the transmission field polarized in direction $P_1$ then propagating through to the open end of the waveguide. Simply because of the proximity of line 99 to IF output line 96, a portion of the signal from oscillator diode 100 is also coupled into the portion of line 96 between the lobes of the fin line structure and is mixed by balanced mixer diodes 94 and 95 with the return or $P_2$ signal to which the fin line structure is responsive. The ground plane for microstrip line 99 is, of course, formed by the underlying wall (not shown) of the waveguide.

Figure 9:
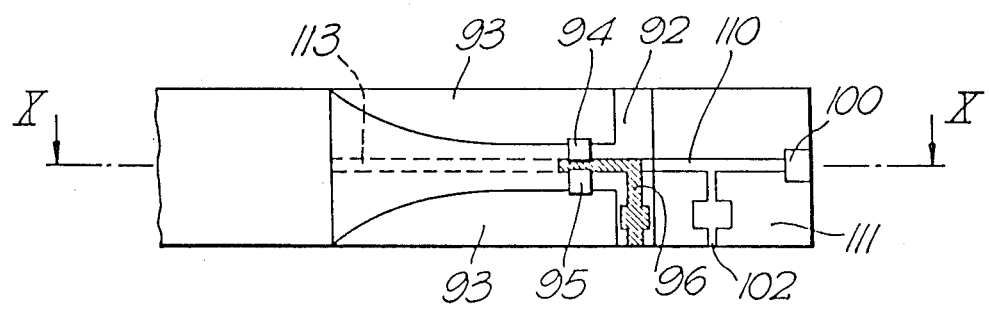
FIG. 9 is a plan view, sectioned on line IX—IX of FIG. 10, of another combined mixer/duplexer/oscillator device.
Figure 10:
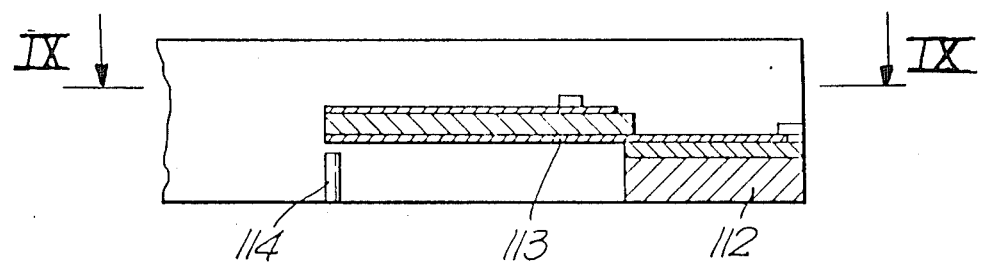
FIG. 10 is a section on line X—X in FIG. 9.

FIGS. 9 and 10 show an embodiment similar to that of FIGS. 7 and 8 except that, here, the microstrip line 110 is formed on a short dielectric sheet section 111 extending only to just past the end of the sheet 92 carrying the fin line structure 93, diodes 94 and 95 and IF output line 96. The sheet 111 is supported on a raised metal portion 112 of the waveguide wall at the shorted end of the waveguide, the portion 112 forming the microstrip ground plane and also raising the microstrip line 110 to the level of the lower surface of sheet 92. As before, an oscillator diode 100 is coupled between the shorted end of the waveguide and that end of the microstrip line 110 which is nearest this end of the waveguide, the diode being biased via line 102. At the end of the sheet 111 which underlies the end of sheet 92, the microstrip line 110 is connected to a strip 113 metallized on the under surface of sheet 92. The strip 113 extends forward as a suspended strip to the other end of the sheet 92 at which point a transition post 114 extends up to close to it from the lower wall (floor) of the waveguide. Transition post 114 acts, in the same way as the downwardly extending post in FIGS. 6 and 7, to form a growth point for the transmission signal field. A portion of the signal from oscillator diode 100 is again coupled into the IF output line portion near diodes 94 and 95 by virtue of the proximity of this portion to strip 113. In this embodiment, the presence of a microstrip section of the oscillator signal line, which section is shorter than that for FIGS. 6 and 7, may produce less loss than in the embodiment of FIGS. 6 and 7.

The basic property of a suitably dimensioned waveguide to support independent cross linear polarization can be integrated with other transmission line forms (notably fin line, microstrip and suspended strip) in order to achieve a compact combination of separate transmit and receive channels, balanced mixer and local oscillator coupling.

This arrangement will replace the normal separate combination of circulator (or Ortho T), directional coupler for local oscillator coupling and balanced mixer. In doing so simplicity is improved and size and cost reduced.

I claim:

1. An FMWC (Frequency Modulated Continuous Wave) system for operation with crossed circular polarization, comprising duplexer and mixer means adapted for receiving transmitted power and return power; and a probe means aligned with a linear polarization of said transmitted power for extracting a portion of said transmitted power, said extracted portion being fed directly to said duplexer and mixer means for mixing with said return.

2. A combined microwave duplexer and mixer comprising:
   a waveguide section;
   circuit means disposed within said waveguide section for receiving first microwave energy polarized in one direction of polarization and passing through said waveguide section in one direction of travel while, in itself, being relatively unresponsive to second microwave energy polarized transverse to said one direction and passing through said waveguide section in a direction opposite to said one direction of travel;
   coupling means disposed within said waveguide section aligned with said polarization transverse to said one direction, for causing a portion of said second microwave energy to be tapped off and to appear within said circuit means; and
   diode means disposed within said waveguide section for causing said first energy and said tapped off portion of the second energy to become mixed and to produce an IF signal.

* * * * *